(12) United States Patent
Kubacki (10) Patent No.: US 6,998,224 B1
(45) Date of Patent: *Feb. 14, 2006

(54) PLASMA DEPOSITED OPTICAL WAVEGUIDE

(76) Inventor: Ronald M. Kubacki, 3514 Rollingside Dr., San Jose, CA (US) 95148

( * ) Notice: Subject to any disclaimer, the term of this patent is extended or adjusted under 35 U.S.C. 154(b) by 0 days.

This patent is subject to a terminal disclaimer.

(21) Appl. No.: 10/899,231

(22) Filed: Jul. 26, 2004

Related U.S. Application Data (60) Division of application No. 10/090,297, filed on Mar. 4, 2002, which is a continuation-in-part of application No. 09/435,396, filed on Nov. 6, 1999, now Pat. No. 6,416,938, which is a continuation-in-part of application No. 08/873,513, filed on Jun. 12, 1997, now abandoned.

(60) Provisional application No. 60/020,392, filed on Jun. 25, 1996.

(51) Int. Cl.
*G03F 7/00* (2006.01)
*G02B 6/00* (2006.01)

(52) U.S. Cl. ............ 430/321; 430/320; 430/322; 385/141; 427/489

(58) Field of Classification Search ............ 430/320, 430/321, 322; 385/141; 427/489
See application file for complete search history.

(56) References Cited

U.S. PATENT DOCUMENTS 4,921,321 A * 5/1990 Weidman ............ 385/130
6,013,418 A * 1/2000 Ma et al. ............ 430/323

* cited by examiner

Primary Examiner—Nicole Barreca (57) ABSTRACT

An optical element, such as a waveguide, is formed by utilizing a plasma deposited precursor optical material wherein the plasma deposition is a two-component reaction comprising a silicon donor, which is non-carbon containing and non-oxygenated, and an organic precursor, which is non-silicon containing and non-oxygenated. The plasma deposition produces a precursor optical material that can be selectively photo-oxidized by exposure to electromagnetic energy in the presence of oxygen to produce photo-oxidized regions that have a selectively lower index of refraction than that of the non-photo-oxidized regions whereby transmission of a light signal through selected non-photo-oxidized and photo-oxidized regions can be controlled. Subsequent photo-oxidation or variable photo-oxidation can be used to produce various discrete regions with different indexes of refraction for fabrication, optimization or repair of photonic structures.

20 Claims, 4 Drawing Sheets

PRIOR ART

PLASMA DEPOSITED OPTICAL WAVEGUIDE

CROSS REFERENCE TO RELATED APPLICATIONS

This application is a division of U.S. application Ser. No. 10/090,297, filed Mar. 4, 2002, which is a continuation-in-part of U.S. application Ser. No. 09/435,396, filed Nov. 6, 1999, now U.S. Pat. No. 6,416,938, which is a continuation-in-part of U.S. application Ser. No. 08/873,513, filed Jun. 12, 1997, now abandoned, which claims the benefit of U.S. Provisional Application No. 60/020,392, filed Jun. 25, 1996, each of which is incorporated herein by reference in its entirety.

FIELD OF THE INVENTION

The present invention relates to an optical element, such as an optical waveguide, and more particularly to an optical element fabricated from the selective photo-oxidation of a material formed by a plasma-initiated polymerization from a two-component reaction.

BACKGROUND OF THE INVENTION

A basic optical signal channel comprises an optical information channel, which for a guided channel, can generally be referred to as a waveguide. The waveguide conducts an optical signal from a first optical component to a second optical component. The optical signal may be light of a single frequency (or color), or may be a multiplexed combination of optical signals of different frequencies in a wavelength multiplexing scheme.

When the waveguide is formed as part of an integrated circuit on a microchip for transmission of the optical signal between components, the on-chip waveguide may be formed as a free-space optical path, or more commonly, a photo-lithographically produced waveguide core material that is surrounded by boundary materials, or cladding. A boundary material has an index of refraction (IOR) that is different from (generally lower) than the IOR of the core. With appropriate selections of IORs for the core and boundary materials based on the frequency characteristics of a particular optical signal, the signal is transmitted through the waveguide core material.

Figure 1:
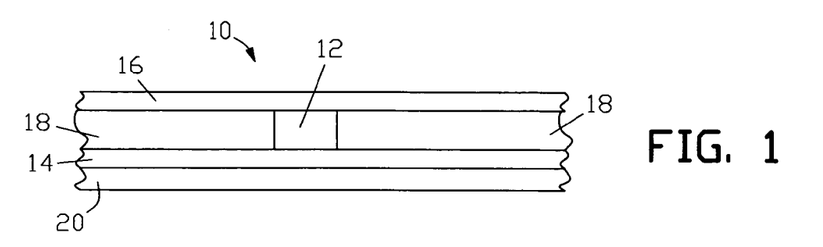
FIG. 1 is a diagrammatic cross sectional view of a typical optical waveguide.
Figure 2A:
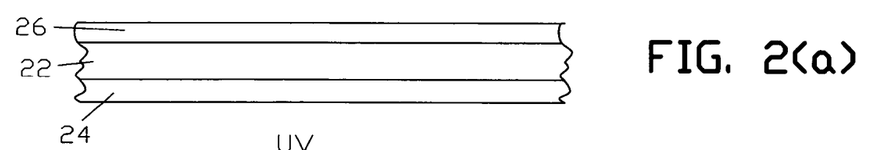
Figure 2B:
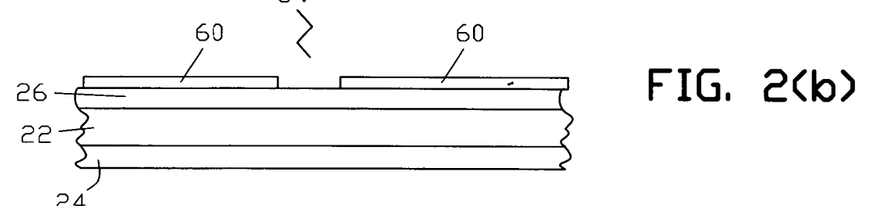
Figure 2C:
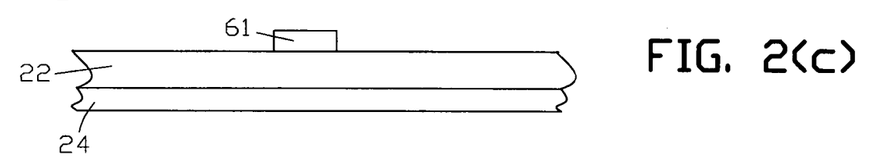
Figure 2D:
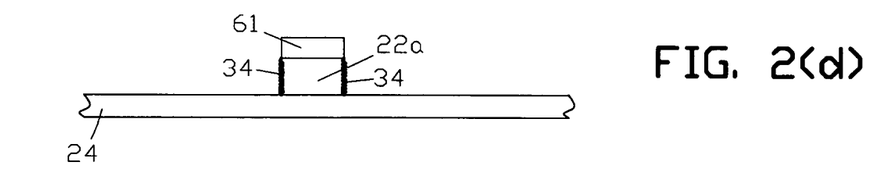
Figure 2E:
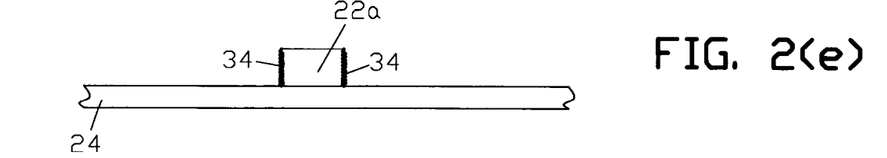
Figure 2F:
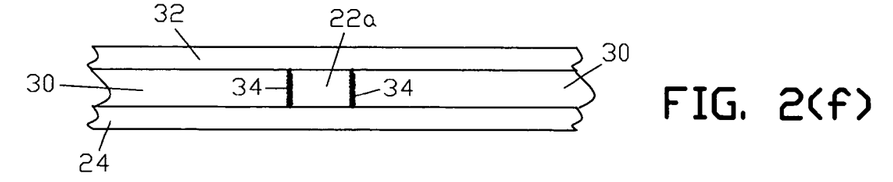

A typical cross section of a basic on-chip waveguide 10 is illustrated in FIG. 1. Core material 12 is surrounded by one or more types of boundary materials which, in this example, are identified as bottom boundary material 14, top boundary material 16 and side boundary material 18. Core material 12 is the optical waveguide material through which a light signal is transmitted. The difference between the IOR of core material 12 and the boundary materials can be as small as 0.001 for a functional optical waveguide. Further the state of the top and bottom boundary materials is not limited. A boundary material may be in the gaseous, liquid or solid state, as long as the material satisfies the differential IOR relationship between boundary materials and the core to permit optical waveguiding. While it may be advantageous for light propagation symmetry to have the IOR of the bottom and top boundary materials equal to the IOR of the side boundary material, it is not necessary, as long as the IOR of all boundary materials is lower than the IOR of core material 12. FIG. 1 also shows a substrate 20 upon which bottom boundary layer 14 is disposed. In other applications the substrate itself may be the bottom boundary layer. For further reference to conventional on-chip optical waveguides see the *Handbook of Photonics*, Gupta, Mool C., editor-in-chief, CRC Press LLC, Boca Raton, Fla., 1997.

Conventional on-chip optical waveguides are formed from either organic or inorganic materials using conventional integrated circuit fabrication and patterning techniques. While these materials, such as silicon dioxide and quartz, are similar to those used in a fiber optic cable, light signal transmission losses through an on-chip waveguide is considerably greater than those experienced through an optical fiber. Light wave propagation losses in an optical waveguide are typically from two sources. The first is optical absorption, or scattering, in the bulk of the waveguide material, while the second is interface scattering from the light interaction with the walls of the waveguide. The conventional fabrication technique for the waveguide core, which requires a blanket layer deposition of a material and subsequent selective removal of the material by photoresist patterning and wet, or dry, chemical etching, results in wall damage of the core that increases the core-boundary material interface scattering losses.

In a conventional process for forming waveguide 10, as illustrated in FIG. 2(a) through FIG. 2(f), waveguide base material 22 is blanket deposited on bottom boundary material 24, which in this example, also serves as the substrate. Photoresist 26 is deposited on waveguide base material 22 (FIG. 2(a)). Photoresist 26 is typically a spun-on organic material that completes crosslinking with selective exposure to ultraviolet (UV) light through a mask 60, and subsequent baking (FIG. 2(b)). Photoresist 26 is selectively developed to leave a photoresist mask 61 over the desired waveguide core, while the remainder of photoresist 26 is etched away by a conventional etching method (FIG. 2 (c)). Excess waveguide base material 22 is etched away by conventional etching methods to form waveguide core 22a, with side walls 34, under photoresist mask 61 (FIG. 2(d)). Then the photoresist mask is etched away (FIG. 2(e)). To complete fabrication of waveguide 10, suitable side boundary material 30 and upper boundary material 32 are deposited around waveguide core 22a (FIG. 2(f)). The etching process that removed the excess waveguide base material 22 resulted in irregularities in the side walls 34 of the waveguide core that increase interface scattering losses for light signals transmitted in the waveguide core.

Also known are optical waveguides formed from material diffusion processes. For example, titanium may be selectively diffused into regions of lithium niobate to form an optical waveguide wherein the diffused regions have a higher IOR than the non-diffused regions.

Therefore there is the need for an on-chip optical waveguide that can be fabricated without the boundaries of the waveguide core being subjected to photoresist etch damage and without the diffusion of a material into the base waveguide material.

With respect to organosilicons that might serve as plasma deposited waveguide material, despite intensive research on the plasma deposition of amorphous silicon from monosilane ($SiH_4$), there have been only a few reports exploring the formation of Si—Si bonded polymers from monosubstituted organosilanes. Haller reported an example of selective dehydrogenative polymerization, but no photochemical studies were described. See Haller, *Journal of the Electrochemical Society A*, Vol. 129, 1987, p. 180, and Inagaki and Hirao, *Journal of Polymer Science A*, Vol. 24, 1986, p. 595. Studies on the plasma chemistry of methylsilane ($MeSiH_3$) have involved higher radio-frequency powers and temperatures which promote formation of amorphous silicon carbide (SiC) rather than reactive polymeric product. See Delpancke, Powers, Vandertop and Somorjai, *Thin Solid Films*, Vol. 202, 1991, p. 289. Low power plasma polymerization of tetramethylsilane and related precursors has been proposed to result in the formation of Si—C—Si linkages. See Wrobel and Wertheimer, *Plasma Deposition, Treatment and Etching of Polymers*, Academic Press, New York, Chapter 3. Such materials lack sufficient absorption in light above approximately 225 nm wavelength, but have been studied as far ultraviolet (193 nm wavelength) resists by Horn and associates. See Horn, Pang and Rothschild, *Journal of Vacuum Science Technology B*, Vol. 8, 1991, p. 1493. Polymer chemistry teaches the use of the basic silanes are insignificant as a monomer for polymerization type of polymer. Furthermore, polysiloxanes are differentiated from the basic silanes, and contrasted as being very important in terms of monomers for polymerization. See Stevens, Malcom P., *Polymer Chemistry, An Introduction*, Addison-Wesley Publishing Co., 1975: p. 334.

Work has been reported on the synthesis of soluble poly-alkylsilyne network polymers ($[SiR]_n$) which exhibit intense ultraviolet absorption (associated with extended Si—Si bonding) and may be photo-oxidatively patterned to give stable siloxane networks. See Bianconi and Weidman, *Journal of the American Chemical Society*, Vol. 110, 1988, p. 2341. Dry development is accomplished by selective anisotropic removal of unexposed material by chlorine or hydrobromic acid reactive ion etching. See Hornak, Weidman and Kwock, *Journal of Applied Physics*, Vol. 67, 1990, p. 2235, and Horn, Pang and Rothschild, *Journal of Vacuum Science Technology B*, Vol. 8, 1991, p. 1493. The exposed, oxidized material may be removed by either wet or dry fluorine based chemistry. Kunz and associates have shown that this makes polysilynes particularly effective as 193 nm wavelength photoresists. See Kunz, Bianconi, Horn, Paladugu, Shaver, Smith, and Freed, *Proceedings of the Society of Photo-optical and Instrumentation Engineers*, Vol. 218, 1991, p. 1466. The high absorbability and the wavelength limits photo-oxidation to the surface, eliminating reflection, and the pattern is transferred through the remainder of the film during the reactive ion etch (RIE) development. Studies of organosilicon hydride network materials containing reactive R—Si—H moieties have found that such high silicon compositions as $[MeSiH_{0.5}]_n$ exhibit superior photosensitivity and function as single layer photodefinable glass etch masks. See Weidman and Joshi, *New Photodefinable Glass Etch Masks for Entirely Dry Photolithography: Plasma Deposited Organosilicon Hydride Polymers*, Applied Physics Letters, Vol. 62, No. 4, 1993, p. 372. However, cost and availability of the exotic organosilicon feedstocks have significantly inhibited the transfer of such photosensitive organosilicon hydride network materials into microcircuit fabrication. Further, films deposited from single component organosilicon feedstocks possess limited latitude in alteration of deposited film characteristics, such as the radiation frequency of photosensitivity and selectivity during etch processes.

BRIEF SUMMARY OF THE INVENTION

One aspect of the present invention is an optical element fabricated from a selective photo-oxidation of a material formed from a two-component plasma reaction in a substantially air-evacuated plasma chamber wherein the first component of the two-component reaction comprises a non-carbon containing and non-oxygenated silicon donor, and the second component comprises a non-silicon containing and non-oxygenated organic precursor. The photo-oxidized material exhibits an index of refraction that is lower than that of the non-photo-oxidized material to form an optical element that will alter a light signal passing through the optical element.

Another aspect of the present invention is an optical waveguide formed from a selective photo-oxidation of a material formed from a two-component plasma reaction in a substantially air-evacuated plasma chamber wherein the first component of the two-component reaction comprises a non-carbon containing and non-oxygenated silicon donor, and the second component comprises a non-silicon containing and non-oxygenated organic precursor. In one application, the non-photo-oxidized material forms the waveguide core and the photo-oxidized material forms boundary walls of the waveguide core without the need for etching processes.

These and other aspects of the invention are set forth in the specification and appended claims.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

FIG. 2(*a*) through FIG. 2(*f*) are diagrammatic cross sectional views illustrating the process of forming an optical waveguide with conventional photoresist methods.

FIG. 3(*a*) through FIG. 3(*e*) are diagrammatic cross sectional views illustrating the process of forming one example of a plasma deposited optical waveguide of the present invention.

DETAILED DESCRIPTION OF THE INVENTION

FIG. 3(*a*) through FIG. 3(*e*) illustrate one method of fabricating a plasma deposited optical waveguide 50 of the present invention. Bottom boundary material 52 is deposited on substrate 54 by any suitable method (FIG. 3(*a*)). For example, a bottom boundary material of silicon dioxide, 500 nm thick and having an IOR of approximately 1.448, may be formed on a semiconductor grade silicon wafer by thermal oxidation. The bottom boundary material serves as an optical barrier to a light signal transmitted in the waveguide core and may be any material with an IOR that is different from that of the waveguide core material. In other examples of the invention, the bottom boundary material and substrate may be the same material.

Figure 3A:
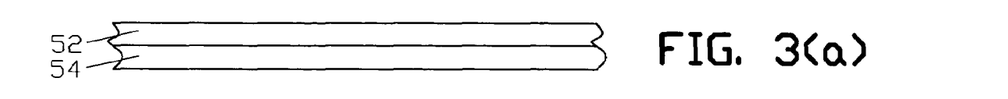
Figure 3B:
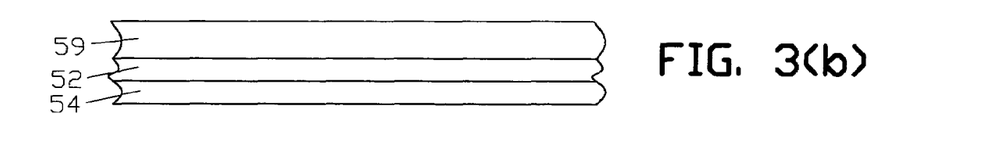
Figure 3C:
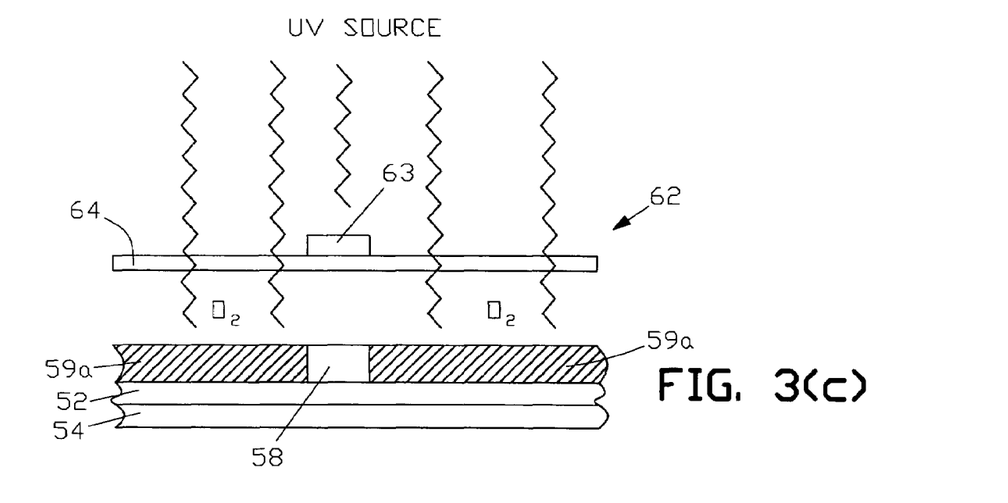
Figure 3D:
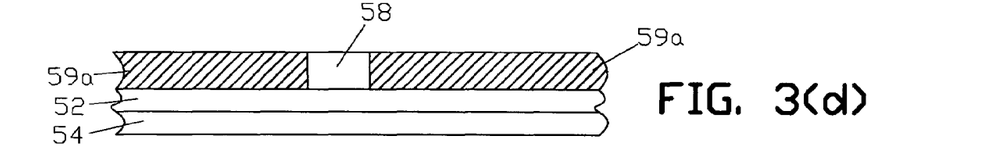
Figure 3E:
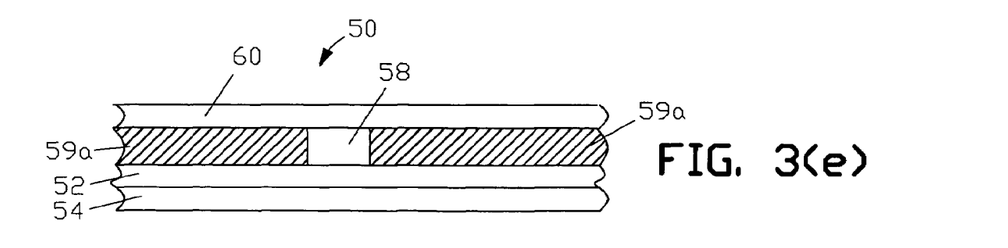

The substrate with deposited bottom boundary material is fixed in a plasma deposition chamber as further described below. After air is evacuated from the chamber, a two-component plasma reaction, wherein the first component comprises a non-carbon containing and non-oxygenated silicon donor, and the second component comprises a non-silicon containing and non-oxygenated organic precursor, deposits a photosensitive precursor waveguide material 59 on bottom boundary material 52 as shown in FIG. 3(b). A non-limiting thickness for the precursor waveguide material would be approximately 1,750 nm. When using photolithography, a suitable mask is fabricated to selectively expose the region of the precursor waveguide material that will form the side boundary material of the waveguide core (or while simultaneously defining the region of the precursor waveguide material that will form the desired waveguide core) to suitable radiated electromagnetic energy in the presence of oxygen. For example, a non-limiting example of a suitable mask 62 is illustrated in FIG. 3(c). Mask 62 comprises a patterned chrome emulsion mask coating 63 deposited on a suitable substrate 64, such as quartz or a glass. A suitable source of radiated energy, in this example, UV light, is applied through the mask to the precursor waveguide material. The chrome mask coating absorbs the radiated energy and the substrate allows the transmission of the radiated energy to the regions of the precursor waveguide material that will form side boundary material 59a of the waveguide. While a projection mask is illustrated in FIG. 3(c), a contact mask may also be used. Other non-limiting methods of photo-oxidation of the precursor waveguide material includes the use of a gray scale photomask for photo-oxidizing multiple regions of the precursor waveguide material to different levels (IORs) with a single exposure radiation dosage, or the use of successive dosages with appropriate masking to gradually lower the IOR of one or more selected regions of the material. Further in methods of applying other sources of radiated energy, such as e-beams or focused scanning deep UV lasers, a mask may or may not be required. Photo-oxidation of the precursor waveguide material in the regions that form the side boundary material will make its IOR lower than that of the remaining non-photo-oxidized precursor waveguide material that forms waveguide core 58. The actual cross sectional width of the photo-oxidized side boundary material need only be of sufficient depth to effectively propagate a particular light signal transmitted by the waveguide core. A suitable top boundary material 60, such as silicon oxide film deposited by a room temperature chemical vapor deposition process, is formed over the side boundary material and waveguide core to complete fabrication of waveguide 50 as shown in FIG. 3(e). As with the bottom boundary material, top boundary material 60 may be any material with an IOR that is different from (generally lower than) that of the waveguide core material. The above process produces a waveguide without the disadvantages associated with a photoresist, chemical or physical etch, or diffusion process. The side boundary and top boundary materials can be etched in a fluorine-based etchant so that vias can be provided for any electrical connections.

The plasma-deposited photosensitive polymer used for precursor waveguide material 59 is produced by flowing a silicon donor and an organic precursor into an evacuated plasma chamber, wherein the donor and precursor react and deposit the precursor waveguide material on the bottom boundary material 52 (disposed on substrate 54 for this example, and referred to as "substrated bottom boundary material") fixed in the chamber. Any plasma chamber with the following characteristics would be suitable for the process:

(1) hardware for evacuating the chamber to eliminate the presence of oxygen;
(2) electrodes supplied with electrical energy to sustain the plasma;
(3) hardware for flowing the silicon donor and organic precursor through the plasma chamber at controlled flow pressures; and
(4) hardware for holding the substrated bottom boundary material in position in the plasma chamber.

For the deposition of these particular materials, a Model DSN Room Temperature Plasma Deposition System, which is available from Ionic Systems (San Jose, Calif.), was used. This plasma chamber is substantially as disclosed in U.S. Pat. No. 4,262,631, which is incorporated herein by reference. The ability to perform the plasma deposition of the precursor waveguide material, and all subsequent waveguide fabrication processes at room temperature, makes the plasma deposited waveguide of the present invention particularly suitable for optoelectronic applications. The plasma chamber was equipped with dual power supplies of 2,500 W and 1,000 W that operated at 13.56 MHz. The plasma chamber was vacuum pumped with an Edwards High Vacuum International (Wilmington, Mass.) Model E2M-80 direct drive rotary vane pump. Flow pressures were monitored with an M K S Instruments, Inc. (Andover, Mass.) Series 220 BARATRON.

With use of the Model DSN Room Temperature Plasma Deposition System, the substrated bottom boundary material can be fixtured in the positive column of the plasma discharge. This reduces the bombardment by energetic species as there is no net charge density in the positive column which reduces crosslinking in the deposited precursor waveguide material.

The materials used as silicon donor and organic precursor must be in a gaseous or vapor state to achieve flow through the plasma chamber. Selection of materials for the silicon donor and organic precursor will be dependent upon the desired characteristics of the precursor waveguide material, the cost of the materials, and how well-behaved the materials are in the processing environment.

The material used as a silicon donor is a substantially non-carbon containing and non-oxygenated silicon compound. Silicon hydrides, that is, silanes ($Si_nH_{2n+2}$) are preferred. In one preferred embodiment of the invention, monosilane ($SiH_4$) is used as the silicon donor. Other suitable source materials for silicon donors include disilane ($Si_2H_6$) and dichlorosilane ($SiH_2Cl_2$).

The material used as an organic precursor is a substantially non-silicon containing and non-oxygenated organic compound. In these preferred embodiments, ethylene ($C_2H_4$), methane ($CH_4$) and ethane ($C_2H_6$) are used as gaseous organic precursors, and toluene ($C_6H_5CH_3$) is used as a liquid vapor donor. Other suitable sources for organic precursors broadly include organic compounds such as alkanes, alkenes, alkynes, phenyls and aromatic hydrocarbons. Selective organic compounds may be blended to achieve an optimum organic precursor for a desired precursor waveguide material.

In selected embodiments, monosilane is used as the silicon donor, and ethylene gas or toluene vapor is used as organic precursors to deposit the precursor waveguide material. Flow rates of monosilane have been used in the range of 20 to 200 scc/min (preferably 25 to 35 scc/min), and organic precursors flowed at 100 to 300 scc/min (preferably 140 to 180 scc/min). Pressure in the plasma chamber has been allowed to build to 150 to 500 mtorr (preferably in the range of 180 to 300 mtorr). Power for deposition of the material has been applied in densities from 0.8 to 15 mW/cc, with the optimum range being 8 to 10 mW/cc at 13.56 MHz. These operating parameters will be understood by those skilled in the art as typical operating conditions, and not limiting the scope of the invention.

The monosilane used was Semiconductor Grade Silane ($SiH_4$), which is available from Liquid Carbonic Industries Corp. (Oak Brook, Ill.). Organic precursors were 99.9% pure ethylene, supplied by Liquid Carbonic Industries Corp., or ACS Certified Class 1B toluene, supplied by Fisher Chemicals (Fair Lawn, N.J.).

Selected organic precursor materials must have sufficient vapor pressure, with or without heating, to allow their introduction into the plasma chamber. This includes a variety of materials that can be either a gas or liquid at standard temperature and pressure (STP). In most cases, the exposure of a liquid organic precursor in a containment vessel to the vacuum system will generate sufficient vapor flow to allow many liquids, as well as gases, to be used with no operator exposure. If sufficient vapor pressure is not attained, the liquid donor may be heated slightly to increase its vapor pressure. For the processing of the precursor waveguide material in one preferred embodiment of the invention, one gas at STP, ethylene, or one liquid at STP, toluene, is used as organic precursor. Toluene was selected due to its favorable vapor pressure, as well as its ultraviolet transmission characteristics. Neither the silicon donor nor the organic precursor can contain an appreciable amount of oxygen, since oxygen with ultraviolet exposure from the plasma during the deposition process would cause photo-oxidation of the silicon and degrade the photosensitivity of the deposited precursor waveguide material.

A silicon donor that is substantially non-carbon and non-oxygen containing inhibits the polymerization of the silicon donor with the organic precursor during the plasma reaction. This promotes the encasing of plasma generated modified forms of the silicon donor that include (Si—H) and (Si—Si) low molecular weight fragments that are forming a self assembled composite film with nanometer scale silicon—silicon and silicon-hydrogen particles or dots within an organic polymer matrix formed substantially from plasma-polymerization of the organic precursor. Therefore, photo-oxidation is achieved primarily by the oxidation of the silicon within the interstitially situated modified forms of the silicon donor when the material is subjected to radiated electromagnetic energy, such as UV light, in the presence of oxygen.

For the monosilane/ethylene depositions, ethylene was supplied to an inlet port on the plasma chamber and controlled with a manual flow valve. A vessel was used for the containment of liquid toluene for the monosilane/toluene depositions. The liquid nature of toluene at STP required the development of a method for the introduction of toluene vapors to the plasma chamber. A sample cylinder was obtained and thoroughly cleaned for the toluene introduction. After cleaning and drying, the cylinder was attached to the deposition system and evacuated to less that 10 mtorr. At this point, the valve on the sample cylinder was closed and the cylinder removed from the system. A clean stainless steel tube was attached to the sample cylinder. The tube was submerged in a vessel of reagent grade toluene and the shut-off valve was opened. The vacuum inside the sample cylinder was used to draw the toluene into the sample cylinder while introducing as little trapped gas as possible. After installation on the vacuum system, the shut-off valve was opened and the toluene was allowed to degas for fifteen minutes before any plasma processing was attempted. Seasoning runs were performed for one hour before actual depositions were performed for the precursor waveguide material.

A water bath was installed on the liquid toluene vapor source to assist in keeping a constant vapor pressure during the depositions. No heating was used in the bath, but the temperature held at 23° C.±1° C. during depositions. Pressure during depositions held constant within ±5 mtorr. The effect of the evaporative cooling was minimal on the vapor pressure and flow of the liquid toluene donor. Flow from the vessel was controlled with a manually adjusted valve on the top of the containment vessel. Initially, no attempt was made to either heat or hold the liquid vessel isothermal to reduce evaporative cooling, which would have an impact on the ability to maintain constant flow. However, pressure during deposition was constantly monitored to determine if the flow of the toluene was dropping.

Initial depositions of the precursor waveguide material were performed with the plasma chamber's depositor under manual control to easily vary and control deposition conditions. A monosilane flow rate of 50 scc/min was used to establish a plasma chamber pressure with the monosilane, and then varying amounts of organic precursors were flowed to achieve the desired pressure increases. The ratio of the pressure of the organic precursor to the pressure of the monosilane was used for monitoring during the screening. Weight ratios of organic precursor to monosilane of less than 1:4 and greater than 2.5:1 resulted in materials of negligible photosensitivity. For depositions useful for the fabrication of optical elements, weight ratios of organic precursor to monosilane of 1:2 and 1:1 were chosen. In addition, for deposition, input power to the plasma chamber was varied between 200 W and 400 W.

It is preferable to separately flow the silicon donor and organic precursor into the plasma chamber to enhance substantial uniformity of the plasma modified silicon donors within the resulting organic polymer matrix and prevent possible spontaneous pre-reactions. As understood by those skilled in the art, silicon donors and organic precursors can be premixed in a variety of ratios to ensure uniform component distribution, and reduce the cost and complexity of the piping and associated hardware for gas introduction into the plasma chamber. Donors and precursors can also be premixed or mixed in a manifold. Premixing of the silicon donor and organic precursor is acceptable but may require stricter process control to achieve a substantially uniform distribution within the material. Hydrogen or an inert gas may be added to increase uniformity due to its higher mobility.

As understood by those skilled in the art, a variety of deposition systems may be used that operate at a wide variety of power levels and types, including radio frequency range (approximately 40 kHz) through microwave, and electron cyclotron resonance systems operating in excess of 2 GHz. In the preferred embodiments, there is no substrated bottom boundary material heating involved, but the substrated bottom boundary material can be heated or cooled during the deposition process to enhance the properties of the deposited materials. A wide variety of pressures, from ultrahigh vacuum (less than $10^{-7}$ torr) up to and exceeding atmospheric pressure can be used. In the preferred plasma chamber, the substrated bottom boundary material floats electrically, but it can be grounded or powered.

As stated above, lithographic projection is used to selectively expose the precursor waveguide material 59 to electromagnetic energy in the presence of oxygen. Samples of the precursor waveguide material 59 that were prepared by the above processes were exposed to ultraviolet radiation in the presence of oxygen from the air. Exposures were performed at low resolution using UVP, Inc. (Upland, Calif.) Model No. UVG-54 ultraviolet source for use at 254 nm wavelength. Exposures at 365 nm wavelength were made using the same lamp housing with a UVP, Inc. Model No. 34-0034-01 ultraviolet source for use at 365 nm wavelength. Various masks were used for imaging. Photosensitivities were first observed after exposure to 254 nm wavelength deep ultraviolet (i.e., 280 nm or less) with a simple contact mask. The precursor waveguide material deposited by the above disclosed processes had thicknesses ranging from 0.08 to 0.15 $\mu$m. Table 1 illustrates deposition parameters for typical sample depositions using the above process.

TABLE 1

Data for Sample Depositions

| Sample Number | Organic Precursor | Partial Pressure of the Organic Precursor Relative to Silane (%) | Power (W) | Deposition Rate (Å/sec) | Resultant Compressive Stress in Film (Dynes/cm$^2$) |
|---|---|---|---|---|---|
| 1 | Ethylene | 50 | 400 | 0.82 | $2.7 \times 10^8$ |
| 2 | Ethylene | 50 | 200 | 0.71 | $8.3 \times 10^7$ |
| 3 | Ethylene | 100 | 400 | 0.91 | $4.7 \times 10^8$ |
| 4 | Ethylene | 100 | 200 | 0.72 | $0.8 \times 10^8$ |
| 5 | Toluene | 50 | 400 | 0.85 | $3.3 \times 10^8$ |
| 6 | Toluene | 50 | 200 | 0.83 | $7.6 \times 10^7$ |
| 7 | Toluene | 100 | 400 | 0.88 | $2.1 \times 10^8$ |
| 8 | Toluene | 100 | 200 | 0.88 | $9.8 \times 10^7$ |

For the results in Table 1, the monosilane flow rate for all depositions was 50.0 scc/min and the pressure from monosilane flow was 68 to 70 mtorr. Stress measurements were made on bare 1,0,0 silicon wafers. All exposures were made with light at 248 nm wavelength for exposure dosage of 600 mj/sq-cm. Deposited film thickness was 1500 Å.

Photo-oxidation as used in this specification is generally understood to be accomplished by the exposure of a material to radiated electromagnetic energy in the presence of oxygen in air. Selective photo-oxidation is generally achieved by masking regions of the material that will not be photo-oxidized, with masking techniques known, for example, in the art of photolithography. Generally, light energy is used, and more specifically, light in the ultraviolet end of the visible electromagnetic spectrum, typically recognized as from 200 nm to 400 nm is used for the radiated energy. It will be understood by those skilled in the art that other forms of radiant energy, above visible light in the electromagnetic spectrum, such as x-rays, or gamma or alpha radiation, may be used. Furthermore, since oxygen in the air is the agent for oxidation, other concentrations of oxygen can be used, including oxygen that may diffuse through one or more layers of material.

Photosensitivity of the precursor waveguide material 59 was also examined further into the visible region of the electromagnetic spectrum. A single three-inch silicon wafer deposition was prepared by a two-component reaction of monosilane and ethylene to determine exemplary non-photo-oxidized waveguide core stoichiometry and photo-oxidized side boundary material stoichiometry. The substrated bottom boundary layer with deposited precursor waveguide material was quartered. One quarter was exposed to 621 mj/sq-cm with light at 365 nm wavelength, and another quarter was exposed to 621 mj/sq-cm with light at 254 nm wavelength.

An elemental analysis was performed on portions of the two exposed samples and one of the two remaining quarters of unexposed samples. The results are shown in Table 2, which indicates a 1:7 atom ratio of silicon to carbon for the unexposed samples, which could be used as a waveguide core.

TABLE 2

Elemental Analysis for Unexposed and Exposed Samples

| Sample Type | Carbon (%) | Oxygen (%) | Fluorine (%) | Silicon (%) |
|---|---|---|---|---|
| Unexposed | 77 | 10 | 2.3 | 11 |
| Exposed to light at 365 nm wavelength | 74 | 16 | 0 | 9.7 |
| Exposed to light at 254 nm wavelength | 67 | 22 | 2.2 | 9.2 |

Portions of both exposed samples, and one of the quartered unexposed samples, were submitted to Electron Spectroscopy for Chemical Analysis (ESCA). The ESCA analysis of the binding energies for the exposed (side boundary material) and unexposed (waveguide core) samples provided the results indicated in Tables 3A, 3B and 3C.

TABLE 3A

ESCA Binding Energy Data for Unexposed Sample

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Unexposed (Atom Percent) | 71 | 3.9 | 0.0 | 2.0 | 10 | 2.3 | 5.8 | 5.2 | 0.0 |

TABLE 3B

ESCA Binding Energy Data for Sample Exposed at 365 nm

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 365 nm wavelength (Atom Percent) | 68 | 4.9 | 0.0 | 1.2 | 16 | 0.0 | 3.1 | 6.6 | 0.0 |

TABLE 3C

ESCA Binding Energy Data for Sample Exposed at 254 nm

| Peak Assignments | C—R | C—OR | O=C—OR | C→C* | C=O,Si—O | C—F | R—Si | (RSi—O)$_n$ | SiO$_x$ ($1 \leq x \leq 2$) |
|---|---|---|---|---|---|---|---|---|---|
| Binding Energy eV | 284.6 | 285.6 | 288.4 | 291.0 | 532.6 | 689.6 | 100.4 | 102.0 | 102.8 |
| Exposed to light at 254 nm wavelength (Atom Percent) | 56 | 8.6 | 1.6 | 0.6 | 22 | 2.2 | 0.0 | 3.7 | 5.5 |

The bonding information is drawn from high resolution scans of the elemental data and was used to examine the nature of the oxygen bonding as well. Atomic percentages are calculated for the included elements and do not include hydrogen, of which a considerable amount is expected to be present. The ESCA analysis represents approximately 100 Å of the surface of the material.

The ESCA analysis indicates photo-oxidation with light at 254 nm wavelength by increased binding of oxygen at that wavelength when compared to the unexposed sample. The analysis also shows photo-oxidation with light at 365 nm wavelength not as prominent as that with light at 254 nm wavelength. As expected, the incorporation of bound oxygen into the exposed films causes a proportionate reduction in the amount of carbon and silicon present. The binding energy data, from the high resolution scans, provides more insight into the photoreaction at the two frequencies. Peaks which show little significance, or are felt to be attributable to contamination, include the 689.6 eV bonds. However, significant trends did develop for the other represented bonds. Significantly, C—C, C—C*, C—H, Si—C, and Si—H bonds showed decreases with exposure. Furthermore, C—OC, C—OH, C=O, Si—O bonds showed consistent increases with exposure to light at 365 and 254 nm wavelengths. It is also noted that with the exposure to light at 254 nm wavelength, all of the silicon present was bonded to oxygen in some form with no remaining Si—C or Si—H bonds present. The 288.4 eV bond assigned to O=C—OC and O=C—OH are also present with the material exposed to light at 254 nm wavelength, but not at 365 nm wavelength.

The binding energies assigned to C—R and R—Si are the correct energies to be predominantly hydrogen bonds. Therefore, substantially no Si—C bonding is apparent from the analysis for either the unexposed or exposed states. The lack of substantial silicon to carbon bonding is indicative of a film that is not a copolymer of silicon and a hydrocarbon, but comprises (Si—H) and (Si—Si) low molecular weight fragments interstitially situated within a substantially organic polymer matrix that does not contain an appreciable amount of silicon and does not exhibit highly photosensitive behavior. The results show that satisfactory photoreactivity was demonstrated with UV light at 254 nm and 365 nm wavelengths for the precursor waveguide material.

Figure 4:
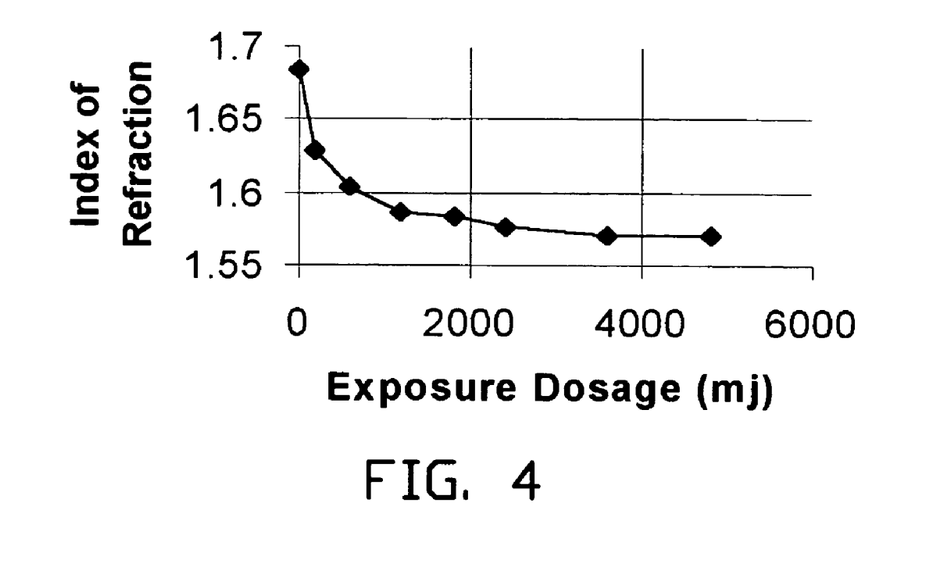
FIG. 4 is a graph illustrating variability of the index of refraction of the plasma deposited optical waveguide material used in the present invention by selective exposure to varying dosages of radiated electromagnetic energy in the presence of oxygen.

FIG. 4 graphically illustrates examples of the ability to vary the IOR of the precursor waveguide material 59 by selectively exposing it to radiated electromagnetic energy of a suitable wavelength in the presence of oxygen to form a photo-oxidized side boundary material 59a that has an IOR lower than that of the non-photo-oxidized waveguide core 58.

For the examples in FIG. 4, the precursor waveguide material is plasma deposited from a two-component reaction wherein the silicon donor is monosilane as specified above, and is maintained at a 50 scc/min flow rate for the deposition. The organic precursor is toluene, as specified above, with a flow rate such that the toluene pressure rise is one-half the silane pressure rise (50% donor concentration). Initial chamber pressure for all depositions was less than 10 mtorr. Input power to the plasma chamber was 200 watts for the plasma deposition.

The section of the precursor waveguide material 59 that forms the side boundary material 59a was exposed to radiated electromagnetic energy, in this example, UV light with a wavelength of 248 nm, at varying dosages. The resulting IOR at each dosage, measured by optical ellipsometry for a 632.8 nm wave, is set forth in Table 4 and illustrated in FIG. 4.

TABLE 4

Change in IOR for Varying Dosage of Radiated Energy Exposure

| Exposure Dosage (mj) | Index of Refraction |
|---|---|
| 0 | 1.684 |
| 200 | 1.629 |
| 600 | 1.604 |
| 1,200 | 1.587 |
| 1,800 | 1.583 |

TABLE 4-continued

Change in IOR for Varying Dosage of Radiated Energy Exposure

| Exposure Dosage (mj) | Index of Refraction |
|---|---|
| 2,400 | 1.576 |
| 3,600 | 1.571 |
| 4,800 | 1.570 |

Therefore, for the precursor waveguide material 59 in this non-limiting example of the invention, a mask 62 was used to expose the region of the precursor waveguide material 59 that would form side boundaries 59*a* while the waveguide core 58 was not exposed. From Table 4, the non-exposed waveguide core 58 (0 exposure dosage) had a 1.684 IOR while the side boundary layers, if subjected to a 1,800 mj exposure dosage, would have an IOR of approximately 1.583. As indicated above, for silicon oxide bottom and top boundary materials, the index of refraction would be approximately 1.448. The data in FIG. 4 illustrates the controllable variation of the IOR in a plane of the precursor waveguide material or film by photo-oxidation of the film for construction and optimization of waveguiding structures and optical signal manipulation structures.

As further examples of the ability to vary the IOR of plasma deposited precursor waveguide materials of the present invention, plasma deposited precursor waveguide material was prepared on substrates of silicon semiconductor wafers that were designated (Sample ID) as indicated in Table 5. For these plasma dispositions of precursor waveguide material, the silicon donor was monosilane and the organic precursor was either ethylene (gas precursor in Table 5) or toluene (liquid precursor in Table 5). The pressure of the organic precursor indicated in the table is relative to the pressure that established the monosilane flow rate indicated in the table. In other words, concentrations of the silicon donor and organic precursor for a particular deposition are related to partial pressures attributable to each component. For example, if the plasma chamber was started at 10 mtorr of pressure, and the monosilane flow stabilized and gave 110 mtorr of pressure, the flow rate (concentration) of monosilane was responsible for 100 mtorr of pressure. If 50 percent concentration of the organic precursor was achieved, then the organic precursor flow rate (concentration) added an additional 50 mtorr of pressure. Process parameters for the plasma deposition of the precursor waveguide material on each substrate are listed in Table 5.

TABLE 5

Data for Plasma Deposition of Precursor Waveguide Material

| Sample ID | Flow Rate of Monosilane (sec/min) | Partial Pressure of the Organic Precursor Relative to Monosilane (%) | Input Power to Plasma Chamber (W) | Duration of Deposition (s) |
|---|---|---|---|---|
| 1 | 50 | 50% (gas precursor) | 200 | 2,200 |
| 3 | 50 | 50% (liquid precursor) | 200 | 2,200 |
| A | 20 | 45% (gas precursor) | 100 | 2,200 |
| C | 60 | 45% (gas precursor) | 100 | 2,200 |
| EE | 50 | 30% (liquid precursor) | 400 | 2,200 |

Quadrants of each wafer sample plasma deposited precursor waveguide material were photo-oxidized to varying degrees (including no photo-oxidation—0 exposure time) by varying the exposure dosage to a radiated electromagnetic energy (in this example, UV light source operating at 254 nm wavelength and with an energy density of 1 mj/s from UVP, Inc. Model UVG-54) in the presence of oxygen, as indicated in Table 6. IOR was measured in each quadrant by optical ellipsometry, and was as indicated in Table 6.

TABLE 6

Data for Sample Plasma Deposited Precursor Waveguide Material with Varying Radiation Exposures

| Sample ID | Exposure Dosage (mj) | Sample Quadrant | Film Thickness (Å) | Index Of Refraction |
|---|---|---|---|---|
| 1 | 0 | IV | 1,016 | 1.949 |
|   | 150 | I | 1,013 | 1.959 |
|   | 300 | III | 1,063 | 1.799 |
|   | 450 | II | 1,107 | 1.730 |
| 3 | 0 | IV | 1,009 | 1.669 |
|   | 150 | I | 1,121 | 1.604 |
|   | 300 | III | 1,139 | 1.594 |
|   | 450 | II | 1,155 | 1.589 |
| A | 0 | IV | 713 | 1.787 |
|   | 150 | I | 729 | 1.747 |
|   | 300 | III | 749 | 1.718 |
|   | 450 | II | 770 | 1.680 |
| C | 0 | IV | 387 | 2.718 |
|   | 150 | I | 439 | 1.966 |
|   | 300 | III | 484 | 1.713 |
|   | 450 | II | 540 | 1.654 |
| EE | 0 | IV | 1,284 | 1.726 |
|   | 100 | I | 1,451 | 1.587 |
|   | 200 | III | 1,447 | 1.578 |
|   | 300 | II | 1,560 | 1.543 |

Figure 5:
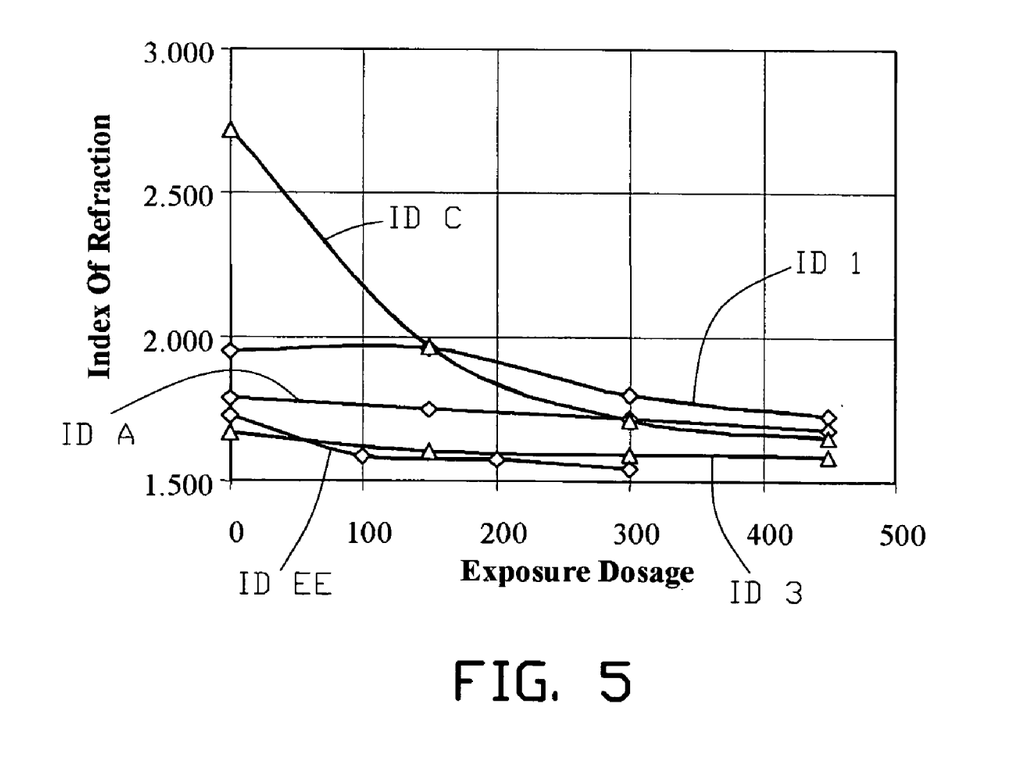
FIG. 5 is a graph illustrating variability of the index of refraction for various samples of the plasma deposited optical waveguide material used in the present invention by selective exposure to varying dosages of radiated electromagnetic energy in the presence of oxygen.

FIG. 5 graphically illustrates the ranges of IOR that were achievable with varying degrees of exposure for precursor waveguide materials deposited on sample ID 1, 3, A, C and EE.

It is believed that precursor waveguide materials with a low photo-sensitivity at extremely short wavelengths (i.e., less than approximately 250 nm) will provide superior material stability particularly when silicon oxide is used as a top and bottom boundary sealing material for the waveguide core. Generally optoelectronic devices operate at frequencies above 365 nm, so the IOR of waveguide core material should not detrimentally decrease from photo-oxidation of the waveguide core material by light signals transmitted through the core after the waveguide fabrication is complete. Low photo-sensitivity is generally defined as a plasma deposited precursor waveguide material of the present invention that requires less than 100 mj of exposure to radiated electromagnetic energy with a wavelength of less than approximately 250 nm to achieve a complete IOR change for the material. That is, with this exposure dosage, the material will have decreased to approximately its minimum possible IOR when subjected to this radiation.

The above examples illustrate a process of forming a plasma deposited waveguide core with a substantially uniform IOR that is determined by the IOR of a particular non-photo-oxidized precursor waveguide material, since, in the above examples, the side boundaries are photo-oxidized and the core is not. In other examples of the invention, selected regions of the core are photo-oxidized to form optical elements in the core with varying IORs. For example, by forming a waveguide core from multiple layers of precursor waveguide material, not only can the side boundary material be photo-oxidized, but the waveguide core segment in each layer of precursor waveguide material can be selectively photo-oxidized to form a waveguide core that has a varied IOR along its cross sectional height. This is of particular advantage, for example, in fabricating low loss, small bend radius optical elements or components of compact construction for the transmission of optical signals. The components would have a high refractive index contrast (relative difference in IOR of the core and boundary material or cladding) while allowing a lower index core in another location of the same device to enhance matching the index of the core of the waveguide to the core of a connecting optical component, such as an optical fiber to provide a low loss fiber-to-chip interconnect.

Further localized optical elements may be formed within the base optical material used as the precursor waveguide material by selective photo-oxidizing regions of the material. For example, a quarter-wave plate may be formed by selectively photo-oxidizing regions of the waveguide core. Radiated electromagnetic energy of a suitable frequency can be selectively applied to local regions within the precursor waveguide material, including the waveguide core, for example, with a photolithographic tool, by varied exposures or with a variable gradient mask, or selected points of the waveguide core, for example, with an electronic beam or laser device. In addition to embedding optical elements, an optical element fabricated by the plasma deposited method of the present invention can have its IOR changed subsequent to fabrication by post-fabrication photo-oxidation to rework or tune the optical element. For example, an arrayed waveguide grating fabricated by the plasma deposited method of the present invention having multiple planes of precursor waveguide material photo-oxidized to achieve different IORs in each plane, can have a particular plane further oxidized after fabrication to alter its IOR so that the component optimally performs in a given application.

Figure 6:
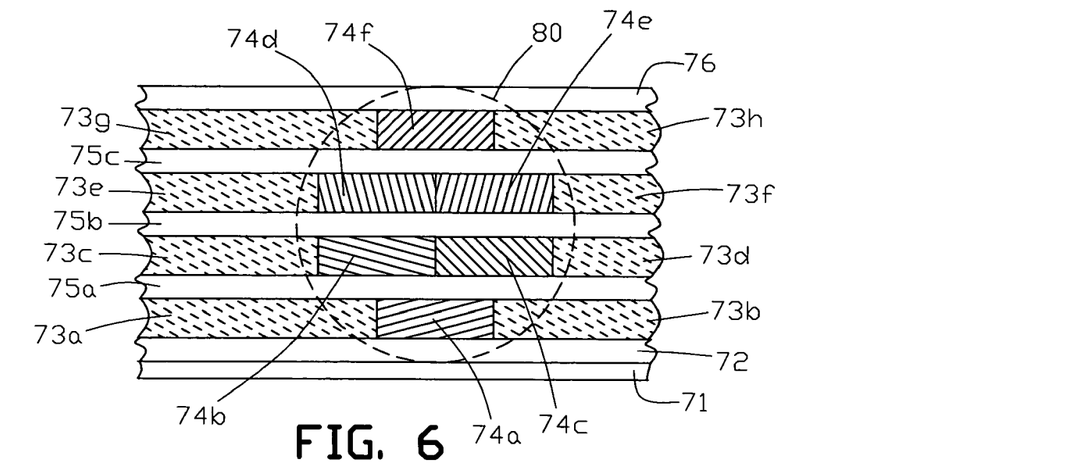
FIG. 6 is a cross sectional view at section line A—A of the vertically stacked waveguide structure shown in FIG. 7.
Figure 7:
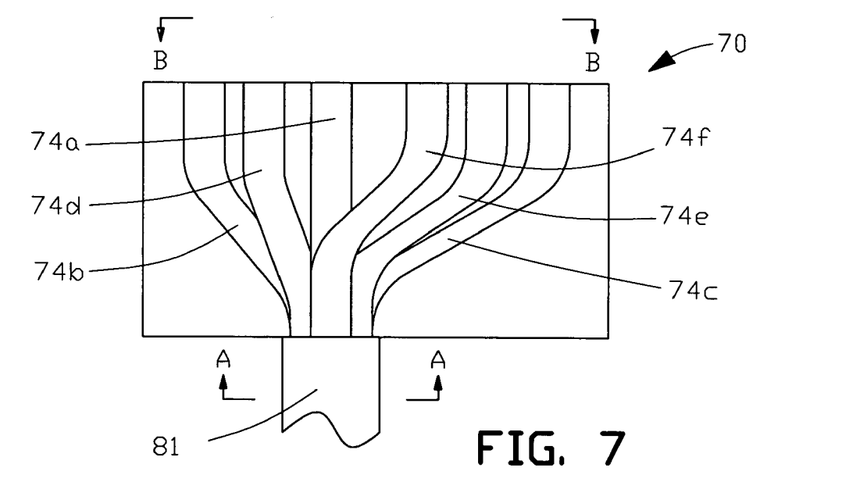
FIG. 7 is a plan view of one example of a vertically stacked waveguide structure of the present invention.
Figure 8:
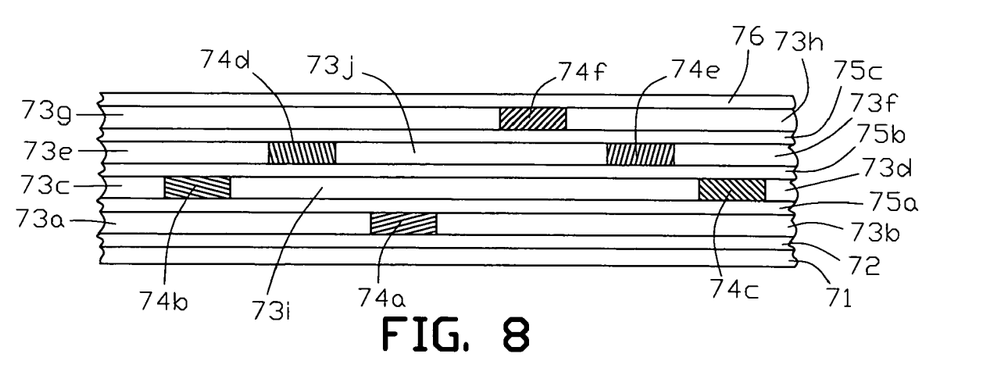
FIG. 8 is a cross sectional view at section line B—B of the vertically stacked waveguide structure shown in FIG. 7.

FIG. 6 through FIG. 8 illustrate a further application of the plasma deposited waveguide of the present invention wherein a vertically stacked, multiple waveguide core, plasma deposited waveguide structure 70 is used as a low loss optical multiplexer/demultiplexer. Referring to FIG. 6, substrate 71 can be any suitable material, such as semiconductor grade silicon. Bottom boundary material 72, such as, but not limited to, silicon oxide, is deposited on substrate 71 by any suitable method. First precursor waveguide material, which is the first precursor waveguide material layer forming the waveguide structure, is deposited on the bottom boundary material by a two-component plasma deposition process of the present invention. The layer of first precursor waveguide material is then selectively photo-oxidized by exposure to suitable radiated electromagnetic energy in the presence of oxygen to form first side boundaries 73a and 73b around first waveguide core 74a. A first radiation barrier layer 75a is then deposited over the first side boundaries and first waveguide core. A second precursor waveguide material is deposited over the first radiation barrier by the two-component plasma deposition process. The layer of second precursor waveguide material is then selectively photo-oxidized by exposure to suitable radiated electromagnetic energy in the presence of oxygen to form second side boundaries 73c and 73d around second waveguide core 74b and third waveguide core 74c, respectively. Either the second or third waveguide core may be as—deposited waveguide base material, while the other is selectively photo-oxidized to produce a waveguide core with an IOR that is less than that for the other waveguide core, and greater than that of its bounding second side boundary. A second radiation barrier layer 75b is then deposited over the second side boundaries, and second and third waveguide cores. A third precursor waveguide material is deposited over the second radiation barrier by the two-component plasma deposition process. The layer of third precursor waveguide material is then selectively photo-oxidized by selective exposure to suitable radiated electromagnetic energy in the presence of oxygen to form third side boundary layers 73e and 73f around fourth waveguide core 74d and fifth waveguide core 74e, respectively. The third side boundaries, and fourth or fifth waveguide cores can then be selectively photo-oxidized by a process similar to that for the second side boundaries, and second or third waveguide cores, to achieve waveguide cores and boundaries with different indexes of refraction. A third radiation barrier layer 75c is then deposited over the third side boundaries, and fourth and fifth waveguide cores. A fourth precursor waveguide material layer, which is the last precursor waveguide material layer forming the waveguide structure, is deposited over the third radiation barrier layer by the two-component plasma deposition process, and the fourth precursor waveguide material layer is selectively photo-oxidized by exposure to suitable radiated electromagnetic energy in the presence of oxygen to form fourth side boundaries 73g and 73h around sixth waveguide core 74f. Finally a suitable top boundary layer 76 is deposited over the fourth side boundary layers and the sixth waveguide core.

While four plasma deposited waveguide core layers are used in the above example of a vertically stacked, multiple waveguide core, plasma deposited waveguide structure of the present invention, a minimum of two waveguide core layers could be used to form selectively photo-oxidized regions in each of the two layers that will delineate one or more waveguide core regions and boundary regions in each of the two layers.

Each radiation barrier layer can be formed from a radiation absorbing or reflecting material, such as a plasma deposited organic polymer material that absorbs the radiation used, for example, UV light, or a sputter deposited metal, such as aluminum, on a silicon oxide base layer.

For use of waveguide structure 70 as a multiplexer/demultiplexer, each plasma deposited layer of precursor waveguide material is selected so that each of the six waveguide cores making up the structure have a unique IOR that is selected to optimally transmit an optical signal of one frequency in a combination of multiplexed optical signals. To achieve this a different combination of silicon donor and/or organic precursor, and/or plasma deposition process conditions, may be used to form a precursor waveguide material in each layer with a different non-photo-oxidized IOR. Then the side boundary regions and/or the core regions in each layer can be selectively photo-oxidized to satisfy the requirements that the IORs of cores in a given layer are greater than the side boundary material adjacent to the core. Alternatively, a single combination of silicon donor and organic precursor may be plasma deposited for all layers of precursor waveguide material. Then the IOR of all side boundary layers and core regions may be selectively altered by photo-oxidation to satisfy the requirements that the IORs of the cores in a given layer are greater than the side boundary material adjacent to a core.

FIG. 6 diagrammatically illustrates in cross sectional elevational at section line A—A in FIG. 7 an input to a vertically stacked, multiple waveguide core plasma deposited waveguide structure 70 when used as a demultiplexer. Circle 80 (in dashed lines) represents the diameter of a glass fiber core of a single mode fiber optic cable 81 that is suitably coupled to waveguide structure 70. A single mode glass fiber core generally has a diameter in the range of 8.3 to 10 micrometers. The optimum waveguide core cross sectional dimensions for an optical signal of 800-nm wavelength would be approximately 1.6 micrometers in height and 4.0 micrometers in width. Forming each of the waveguide cores 74a through 74f with cross sectional dimensions within this range would permit optical coupling of the signal with all six waveguide cores.

If the fiber optic cable carried six multiplexed light signals of different frequencies that were optimally tuned for transmission in only one of the six waveguide cores, each of the six multiplexed light signals would be transmitted through only one of the six waveguide cores. As illustrated in FIG. 7, the six waveguide cores fan out through structure 70 by appropriate selective photo-oxidation patterning in each layer of precursor waveguide material. With this fan out pattern, an optical component, such as a fiber optic cable, can be suitably coupled to each one of the six waveguide cores at the output of the demultiplexer, diagrammatically illustrated in FIG. 8 in cross sectional elevation at section line B—B in FIG. 7. As illustrated in FIG. 8, additional boundary regions 73i and 73j are formed by the fan out pattern and must be appropriately photo-oxidized.

The present invention of a two-component plasma deposited base optical material with an IOR adjustable over a range by selective exposure to suitable radiated electromagnetic energy in the presence of oxygen may be used to fabricate other optical elements wherein a splitting or combining of optical signals of different frequencies (or colors) is desired, for example, in prisms and diffraction gratings. Also as previously mentioned, although the precursor waveguide material is selectively photo-oxidized in regions that form the side boundaries of the waveguide core to form a waveguide having a core IOR greater than that of its boundaries, the precursor waveguide material may also be selectively photo-oxidized in the region that forms the core to form a waveguide having a core IOR less than that of its boundaries.

The foregoing examples do not limit the scope of the disclosed invention. The scope of the disclosed invention is further set forth in the appended claims.

What is claimed is:

1. A method of forming an optical waveguide comprising the steps of:
    forming a bottom boundary material;
    forming a precursor waveguide material having (Si—H) and (Si—Si) low molecular weight fragments interstitially situated within a substantially non-photosensitive organic polymer matrix on the bottom boundary material from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;
    selectively exposing at least one region of the precursor waveguide material to electromagnetic energy in the presence of oxygen to form an at least one photo-oxidized region in the precursor waveguide material; and
    forming a top boundary layer material over the precursor waveguide material.

2. The method of claim 1 wherein the at least one photo-oxidized region of the precursor waveguide material forms the side boundaries of a waveguide core in the non-photo-oxidized precursor waveguide material.

3. The method of claim 1 wherein the at least one photo-oxidized region of the precursor waveguide material forms a waveguide core.

4. The method of claim 1 wherein the second component of the two-component plasma reaction is selected from the group consisting of alkanes, alkenes, alkynes, phenyls and aromatic hydrocarbons.

5. The method of claim 1 wherein the second component of the two-component plasma reaction is selected from the group consisting of ethylene, methane, ethane and toluene.

6. The method of claim 1 wherein the first component of the two-component plasma reaction is selected from the group consisting of monosilane, disilane and dichlorsilane.

7. The method of claim 6 wherein the second component of the two-component plasma reaction is selected from the group consisting of ethylene, methane, ethane and toluene.

8. The method of claim 7 wherein the weight ratio of the second component to the first component of the two-component plasma reaction is between 1:2 and 1:1.

9. A method of forming an optical element for the transmission of a light signal, the method comprising the steps of:
    forming a base optical material having (Si—H) and (Si—Si) low molecular weight fragments interstitially situated within a substantially non-photosensitive organic polymer matrix from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor, the base optical material having a first index of refraction; and
    selectively photo-oxidizing at least one region of the base optical material by exposing the base optical material to radiated electromagnetic energy in the presence of oxygen to form an at least one region of photo-oxidized optical material having a second index of refraction, whereby the transmission of the light signal is selectively guided through the non-photo-oxidized base optical material and the at least one region of photo-oxidized optical material.

10. The method of claim 9 further comprising the steps of:
    selectively photo-oxidizing at least one second region of the base optical material or further photo-oxidizing the at least one region of photo-oxidized optical material to alter the index of refraction of the at least one second region of the base optical material or the at least one region of photo-oxidized optical material, respectively.

11. The method of claim 9 further comprising the steps of:
    selectively guiding the transmission of the light signal through the base optical material and the at least one region of photo-oxidized optical material; and
    selectively photo-oxidizing at least one second region of the base optical material or further photo-oxidizing the at least one region of the photo-oxidized optical material responsive to the transmission of the light signal through the base optical material and the at least one region of photo-oxidized optical material to alter the index of refraction of the at least one second region of the base optical material or the at least one region of the photo-oxidized material, respectively.

12. The method of claim 9 wherein the second component of the two-component plasma reaction is selected from the group consisting of alkanes, alkenes, alkynes, phenyls and aromatic hydrocarbons.

13. The method of claim 9 wherein the second component of the two-component plasma reaction is selected from the group consisting of ethylene, methane, ethane and toluene.

14. The method of claim 9 wherein the first component of the two-component plasma reaction is selected from the group consisting of monosilane, disilane and dichlorsilane.

15. The method of claim 14 wherein the second component of the two-component plasma reaction is selected from the group consisting of ethylene, methane, ethane and toluene.

16. A method of forming an optical waveguide comprising the steps of:
forming an at least two waveguide core layers, each of the at least two waveguide core layers having (Si—H) and (Si—Si) low molecular weight fragments interstitially situated within a substantially non-photosensitive organic polymer matrix from a two-component plasma reaction in a substantially air-evacuated plasma chamber, a first component of the two-component plasma reaction comprising a non-carbon containing and non-oxygenated silicon donor, and a second component of the two-component plasma reaction comprising a non-silicon containing and non-oxygenated organic precursor;
selectively exposing at least one region of each of the at least two waveguide core layers to radiated electromagnetic energy in the presence of oxygen to form an at least one photo-oxidized region in the precursor waveguide material to form an at least one waveguide core in each of the at least two waveguide core layers; and
forming a barrier layer between each of the at least two waveguide core layers to block transmission of the radiated electromagnetic energy.

17. The method of claim 16 wherein the second component of the two-component plasma reaction is selected from the group consisting of alkanes, alkenes, alkynes, phenyls and aromatic hydrocarbons.

18. The method of claim 16 wherein the second component of the two-component plasma reaction is selected from the group consisting of ethylene, methane, ethane and toluene.

19. The method of claim 16 wherein the first component of the two-component plasma reaction is selected from the group consisting of monosilane, disilane and dichlorsilane.

20. The method of claim 19 wherein the second component of the two-component plasma reaction is selected from the group consisting of ethylene, methane, ethane and toluene.

* * * * *